United States Patent [19]
Lee

[11] Patent Number: 5,936,272
[45] Date of Patent: Aug. 10, 1999

[54] DRAM TRANSISTOR CELLS WITH A SELF-ALIGNED STORAGE ELECTRODE CONTACT

[75] Inventor: Kyu-pil Lee, Kyungki-do, Rep. of Korea

[73] Assignee: Samsung Electronics Co., Ltd., Suwon, Rep. of Korea

[21] Appl. No.: 08/670,229

[22] Filed: Jun. 21, 1996

[30] Foreign Application Priority Data

Jun. 23, 1995 [KR] Rep. of Korea ........................ 95-17159

[51] Int. Cl.⁶ ................................................. H01L 27/108
[52] U.S. Cl. ........................... 257/306; 257/308; 257/311
[58] Field of Search ................................... 257/306, 308, 257/311

[56] References Cited

U.S. PATENT DOCUMENTS

| | | | |
|---|---|---|---|
| 3,749,610 | 7/1973 | Swann et al. | 148/187 |
| 4,985,718 | 1/1991 | Ishijima | 357/23.6 |
| 5,335,138 | 8/1994 | Sandhu et al. | 361/303 |
| 5,383,088 | 1/1995 | Chapple-Sokol et al. | 361/305 |
| 5,569,948 | 10/1996 | Kim | 257/382 |

FOREIGN PATENT DOCUMENTS 5-243517  9/1993  Japan ..................... 257/306

*Primary Examiner*—Jerome Jackson, Jr.
*Assistant Examiner*—George C. Eckert, II
*Attorney, Agent, or Firm*—Myers Bigel Sibley & Sajovec

[57] ABSTRACT

A DRAM cell is formed by forming a capped gate line on a substrate, including a gate line insulation layer on the substrate, a gate line on the gate line insulation layer and a gate line cap covering top and sidewall portions of the gate line. Spaced apart source/drain regions are formed in the substrate on opposite sides of the gate line. A dielectric region is formed covering the capped electrode. A storage electrode plug is formed extending from a surface of the dielectric region through the dielectric region and along a first sidewall portion of the gate line cap to contact a first of the source/drain regions. A channel electrode is formed extending from the surface of the dielectric region through the dielectric region and along a second sidewall portion of the gate line cap to contact a second of the source/drain regions. The channel electrode may include a channel line formed on a channel line insulation layer on the dielectric region and having a channel line extension extending through the channel line insulation layer into the dielectric region, and a channel electrode plug extending from the channel line extension to the second source/drain region. Alternatively, the channel electrode includes a channel line formed overlying the second source/drain region and extending to directly contact the second source/drain region. A channel line cap preferably covers top and sidewall portions of the channel line, and a storage electrode formed along a sidewall portion thereof.

6 Claims, 8 Drawing Sheets

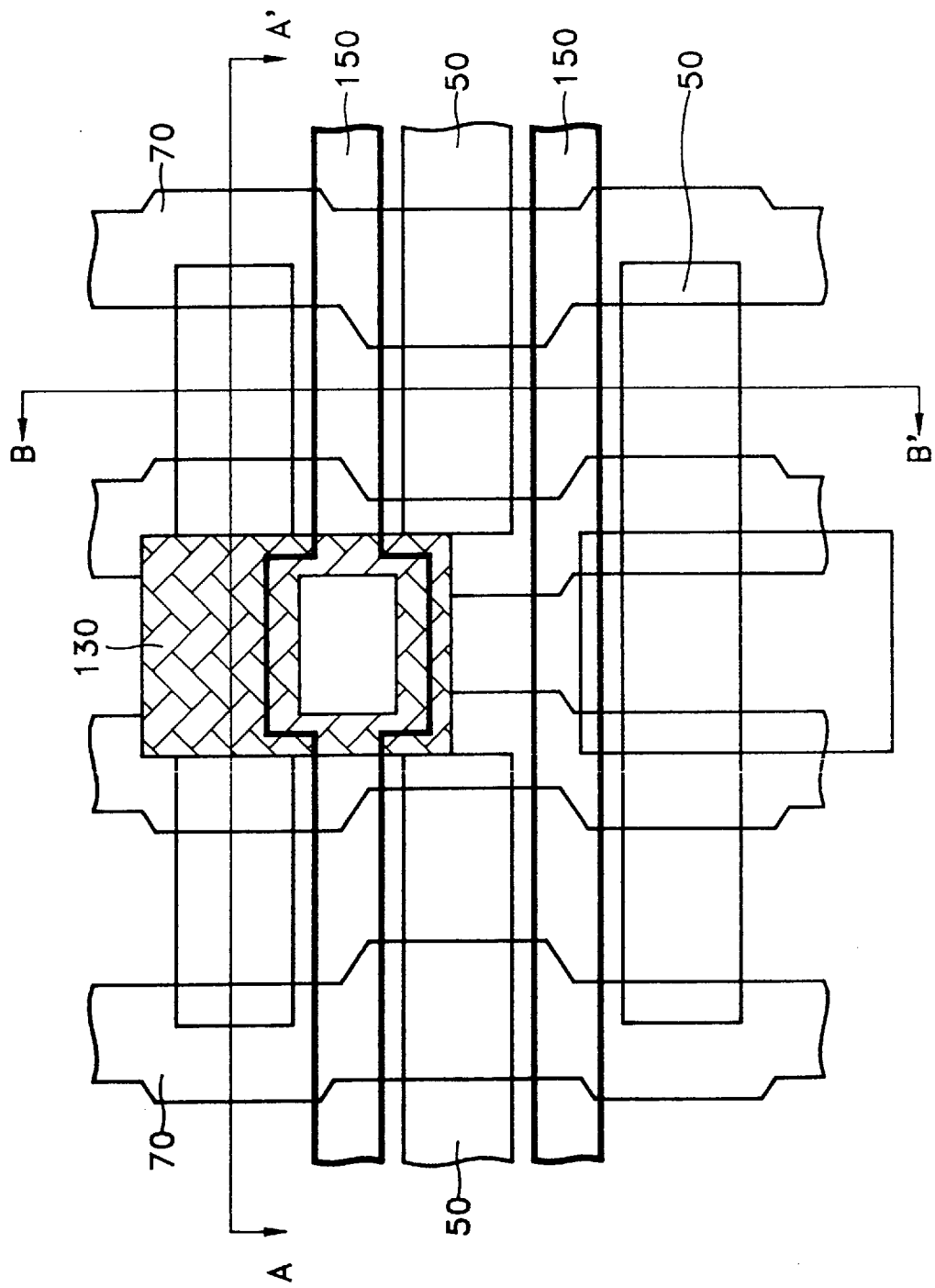

DRAM TRANSISTOR CELLS WITH A SELF-ALIGNED STORAGE ELECTRODE CONTACT

FIELD OF THE INVENTION

The present invention relates to methods of fabricating integrated circuit devices, in particular, to methods of fabricating transistor cells for dynamic random access memory (DRAM) devices and other integrated circuit devices.

BACKGROUND OF THE INVENTION

The design rule for high-integrated memory devices is generally declining, from approximately 1 μm for the generation of 1 Mbit-grade dynamic random access memory (DRAM) devices, to approximately 0.15 μm for Gbit-grade DRAMs. As the design rule decreases, the size of the contact holes used to connect storage capacitor structures in DRAMs generally decreases as well, with an accompanying increase in aspect ratio of the contact hole. The decreasing area, coupled with the increasing aspect ratio, may impose a large burden on the capabilities of photolithography. Alignment margins are generally decreased, which may affect yields.

Development work on DRAMs has concentrated on enhancing capacitance in a limited unit area, and has led to the development of stacked or trench capacitor structures which replace traditional planar capacitors. The stacked capacitor structure has been further developed into a cylinder type or fin type capacitor in order to enhance the surface of the capacitor electrode. From a processing standpoint, cylinder type structures can be divided into two main classes, capacitors formed over a bitline (COB), and capacitors formed under a bitline (CUB). The COB structure enables a capacitor to be formed regardless of bitline process margin, and thus may enhance capacitance within the limited area. However, in the COB structure, the process margin for electrically connecting a storage node with a source region of a transistor is limited by the design rule of the bitline.

FIG. 1 is a cross-sectional view of a DRAM cell manufactured by a conventional method, including a semiconductor substrate 10, a field region 12, a source region 13, a first dielectric film 14, a bitline 16 formed of polycide including accumulated layers of polysilicon and silicide, a capping insulating layer 17, a second dielectric film 18, a spacer 21, and a storage node 23. According to some conventional methods, to obtain alignment margin of the BC process, self-alignment using the bitline 16 is used. To prevent bitline 16 from being shorted to storage node 23, a spacer 21 is provided at the sidewall of the contact hole.

However, when forming a BC according to the conventional method for a design rule appropriated for a Gbit-grade DRAM, the aspect ratio of the BC may be equal to or greater than 6. Because of this, it may be difficult to expose the source region 13 without overetching adjacent structures. In addition, the diameter of the BC may be too small to form the spacer 21. Thus, not only alignment margin but also etching margin is important for deep submicron devices.

FIG. 2 is a cross-sectional view of a DRAM cell manufactured by another conventional technique. According to this technique, a conductive pad 25 is used to reduce the aspect ratio of the BC and thus ameliorate some of the difficulties which may be involved in dry-etching the BC. The conductive pad 25 and a similar conductive pad for connecting the bitline are typically concurrently formed, so that etching depth is reduced when forming the BC, thus allowing etching margin to be maintained. Unfortunately, however, density of integration may be limited, as a stringer or bridge may be generated between the pads as the interval between the conductive pads is further reduced.

SUMMARY OF THE INVENTION

In light of the foregoing, it is an object of the present invention to provide a highly-integrated transistor cell for dynamic random access memory (DRAM) devices, and methods of fabrication therefor.

It is another object of the present invention to provide DRAM transistor cells which are less likely to form stringers or bridges between contacts, and methods of fabrication therefor.

It is another object of the present invention to provide DRAM transistor cells having improved alignment and etching margin, and methods of fabrication therefor.

These and other objects, features and advantages are provided according to the present invention by DRAM cells in which a self-aligned storage electrode plug and a self-aligned channel electrode, e.g. a bit line for the cell, are formed on opposite sides of a capped gate line, e.g., a word line for the cell. A dielectric region is formed covering the capped gate line. The storage electrode plug is formed extending from the surface of dielectric region through the dielectric region and along a first sidewall portion of the gate line cap to contact a first source/drain region in the substrate. The channel electrode is formed extending from the surface of the dielectric region, extending into the dielectric region and along a second sidewall portion of the gate line cap to contact a second source/drain region in the substrate. In first and second embodiments, the channel electrode includes a channel line and a separately formed channel electrode plug which connects the channel line to a second source/drain region in the substrate. A channel line cap covering top and sidewall portions of the channel line includes a channel line capping layer on a top portion of the channel line and channel line sidewall spacers on sidewall portions of the capping layer and the channel line in the first embodiment, and which may extend to cover sidewall portions of the channel insulation layer in the second embodiment. In a third embodiment, the channel electrode includes a channel line which overlies the second source/drain region and has a channel line extension contacting the second source/drain region in a continuous manner.

Providing a self-aligned storage electrode plug provides a lower aspect ratio buried contact on which a storage electrode may be subsequently formed, thus allowing for improved etching and alignment margins. Forming the channel electrode as a continuous structure can reduce the number of operations used in producing the DRAM cell, by not requiring the formation of a separate channel electrode plug. Forming the channel line sidewall spacers to extend adjacent the channel line insulation layer, the probability of the formation of shorts between the channel electrode and the storage electrode may be reduced.

In particular, according to the present invention, a dynamic random access memory (DRAM) cell includes a capped gate line on a substrate, the capped gate line including a gate line insulation layer on the substrate, a gate line on the gate line insulation layer and a gate line cap on top and sidewall portions of the gate line. The cell also includes spaced apart source/drain regions in the substrate on opposite sides of the gate line, and a dielectric region on the substrate, covering the capped gate line, the dielectric region having a surface. The cell also includes a storage electrode plug extending from the surface of the dielectric region to contact a first of the source/drain regions, and a channel electrode extending from the surface of the dielectric region through the dielectric region and along a second sidewall portion of the gate line cap to contact a second of the source/drain regions.

The dielectric region preferably includes a first dielectric layer covering the capped gate line, a second dielectric layer on the first dielectric layer, and a third dielectric layer on the second dielectric layer. The storage electrode plug preferably extends from a surface of the third dielectric layer to the first source/drain region.

The gate line preferably includes a first gate line region, preferably doped polysilicon, on the gate line insulation layer and a second gate line region, preferably metal silicide, on the first gate line region. The gate line cap preferably includes at least one of silicon dioxide and silicon nitride, and includes a gate line capping layer on a top portion of the gate line and gate line sidewall spacers covering sidewall portions of the gate line and the gate line capping layer.

According to first and second embodiments, the channel electrode includes a channel line and a channel electrode plug. The channel line is on a channel line insulation layer on the dielectric, the channel line having a channel line extension extending through the channel line insulation layer into the dielectric region. The channel electrode plug extends from the channel line extension through the dielectric region and along the second sidewall portion of the gate line cap to contact the second source/drain region. Preferably the dielectric region includes a first dielectric layer covering the capped gate line, a second dielectric layer on the first dielectric layer, and a third dielectric layer on the second dielectric layer.

A channel line cap preferably covers top and sidewall portions of the channel line. According to the first embodiment, the channel line cap includes a channel line capping layer on a top portion of the channel line and channel line sidewall spacers covering sidewall portions of the channel line and the channel line capping layer. According to the second embodiment, the channel line cap includes a channel line capping layer on a top portion of the channel line and gate line sidewall spacers covering sidewall portions of the channel line, the channel line capping layer and the channel line insulation layer.

According to a third embodiment, the channel electrode includes a continuous channel line on the channel line insulation layer, overlying the second source/drain region, and having a channel line extension extending through the channel line insulation layer and the dielectric region and along the second sidewall portion of the gate line cap to contact the second source/drain region. A channel line cap covers top and sidewall portions of the channel line, and includes a channel line capping layer and channel line sidewall spacers. As with the first embodiment, the channel line sidewall spacers may cover sidewall portions of the channel line capping layer and the channel line, or, as in the second embodiment, may extend to cover sidewall portions of the channel line insulation layer. The DRAM cell may also include a storage electrode contacting the storage electrode plug, preferably adjacent a sidewall portion of the channel line cap.

According to method aspects of the present invention, a DRAM cell is formed by forming a capped gate line on a substrate, the capped gate line including a gate line insulation layer on the substrate, a gate line on the gate line insulation layer and a gate line cap covering top and sidewall portions of the gate line. Spaced apart source/drain regions are formed in the substrate on opposite sides of the gate line. A dielectric region is formed on the substrate, covering the capped gate line, the dielectric region having a surface. A storage electrode plug is formed extending from the surface of the dielectric region, through the dielectric region and along a first sidewall portion of the gate line cap to contact a first of the source/drain regions. A channel electrode is formed extending from the surface of the dielectric region through the dielectric region and along a second sidewall portion of the gate line cap to contact a second of the source/drain regions.

The capped gate line may be formed by forming a first insulation layer on the substrate, forming a first conductive layer on the gate line insulation layer, forming a second conductive layer on the first conductive layer, forming a second insulation layer on the second conductive layer, and patterning the second insulation layer, the second conductive layer, the first conductive layer, and the first insulation layer to form a gate line insulation layer on the substrate, a gate line on the gate line insulation layer, and a gate line capping layer on the gate line. The spaced apart source/drain regions may be formed by implanting ions into the substrate using the gate line capping layer, the gate line, and the gate line insulation layer as a mask. The gate line cap may be formed by forming a third insulation layer on the substrate, covering sidewall portions of the gate line capping layer, the gate line, and the gate line insulation layer, and anisotropically etching the third insulation layer to leave gate line sidewall spacers on sidewall portions of the gate line capping layer, the gate line, and the gate line insulation layer.

The storage electrode may be formed by removing portions of the dielectric region overlying the first source/drain region to thereby expose the first source/drain region. A conductive layer is then formed on the substrate, the conductive layer contacting the exposed first source/drain region, and the substrate is planarized to remove portions of the conductive layer overlying the dielectric region and leave a storage electrode plug extending from the surface of the dielectric region, through the dielectric region and along the first sidewall portion of the gate line cap to contact the first source/drain region. The dielectric region preferably is formed by forming a first dielectric layer on the substrate, covering the capped gate line, forming a second dielectric layer on the first dielectric layer, and forming a third dielectric layer on the second dielectric layer. The storage electrode plug may be formed by removing portions of the third, second and first dielectric layers overlying the first source/drain region to thereby expose the first sidewall portion of the gate line cap and the first source/drain region, forming a conductive layer on the first dielectric layer, the conductive layer extending through the third, second and first dielectric layers and along the exposed first sidewall portion of the gate line cap to contact the exposed first source/drain region, and planarizing the substrate to remove portions of the conductive layer overlying the third dielectric layer and leave a storage electrode plug extending from the surface of the dielectric region to contact the first source/drain region. Preferably, the third dielectric layer comprises silicon nitride, and the substrate is planarized by chemical mechanical polishing the substrate using the third dielectric layer as a polishing stopper, or by etching back the substrate using the third dielectric layer as an etching stopper.

According to first and second method aspects, the channel electrode is formed as two components. A channel electrode plug is formed extending along a first sidewall portion of the gate line cap to contact a first of the source/drain regions, the dielectric region is formed on the substrate, covering the capped gate line and the channel electrode plug, a channel line insulation layer is formed on the dielectric region, and a channel line is formed on the channel line insulation layer, the channel line having a channel line extension extending into the dielectric region to contact the channel electrode plug. Preferably, a first dielectric layer is formed covering the capped gate line, before forming the channel electrode plug on the first dielectric layer, the channel electrode plug extending through the first dielectric layer and along side the first sidewall portion of the gate line cap to contact the first source/drain region. The channel electrode plug may be formed by removing portions of the first dielectric layer overlying the second source/drain region to expose the first sidewall portion of the gate line cap and the first source/drain region, forming a conductive layer on the first dielectric layer, the conductive layer extending through the first dielectric layer and along the exposed first sidewall portion of the gate line cap to contact the exposed first source/drain region, and patterning the conductive layer to form a channel electrode plug.

According to the first method aspect, the dielectric region is formed by forming a second dielectric layer covering the first dielectric layer and the channel electrode plug, and forming a third dielectric layer on the second dielectric layer. The channel line may then be formed by forming a first insulation layer on the third dielectric layer, removing portions of the first insulation layer, the third dielectric layer and the second dielectric layer overlying the channel electrode plug to thereby expose portions of the channel electrode plug, forming a conductive layer on the substrate, contacting exposed portions of the channel electrode plug, forming a second insulation layer on the conductive layer, and patterning the second insulation layer and the conductive layer to form a channel line on the first insulation layer, the channel line having a channel line extension extending through the first insulation layer to contact the channel electrode plug, and a channel line capping layer on the channel line. Preferably, the first insulation layer is formed by chemical vapor depositing silicon dioxide on the third dielectric layer at approximately 300° C. to approximately 400° C. Preferably, a third insulation layer is formed covering sidewall portions of the channel line capping layer and the channel line, and the third insulation layer and the first insulation layer anisotropically etched to form channel line sidewall spacers on sidewall portions of the channel line capping layer and the channel line, and to thereby form a channel line cap covering top and sidewall portions of the channel line and leave a channel line insulation layer underlying the channel line and the channel line sidewall spacers.

According to a second method aspect, the channel line cap is formed differently. The dielectric region is formed by forming a second dielectric layer on the substrate, covering the channel electrode plug, and forming a third dielectric layer on the second dielectric layer. The channel line is then formed by forming a first insulation layer on the third dielectric layer, removing portions of the first insulation layer, the third dielectric layer and the second dielectric layer overlying the channel electrode plug to thereby expose portions of the channel electrode plug, forming a conductive layer on the substrate, contacting exposed portions of the channel electrode plug, forming a second insulation layer on the conductive layer, and patterning the second insulation layer, the conductive layer and the first insulation layer to form a channel line insulation layer on the third dielectric layer, a channel line on the channel line insulation layer, the channel line having a channel line extension extending through the channel line insulation layer to contact the channel electrode plug, and a channel line capping layer on the channel line. Channel line sidewall spacers are then formed covering sidewall portions of the channel line capping layer, the channel line, and the channel line insulation layer.

According to a third method aspect, a one-piece channel electrode is formed. A channel line is formed on the channel line insulation layer, the channel line having a channel line extension extending through the dielectric region and along a second sidewall portion of the gate line cap to contact a source/drain region directly. A channel line cap is formed on top and sidewall portions of the channel line, in a manner similar to the first and second method aspects.

For each of the above-described method aspects, a storage electrode may be formed on the storage electrode plug, along a sidewall portion of the channel line cap, and a dielectric, plate electrode and interconnections formed to complete fabrication of a DRAM cell. Thus, improved DRAM cells, and methods of fabrication therefor, are provided.

BRIEF DESCRIPTION OF THE DRAWINGS

Some of the objects and advantages of the present invention having been stated, others will be more fully understood from the detailed description that follows and by reference to the accompanying drawings in which:

FIG. 3 is a plan view illustrating a DRAM cell according to the present invention;

DETAILED DESCRIPTION OF THE ILLUSTRATED EMBODIMENTS

Figure 1:
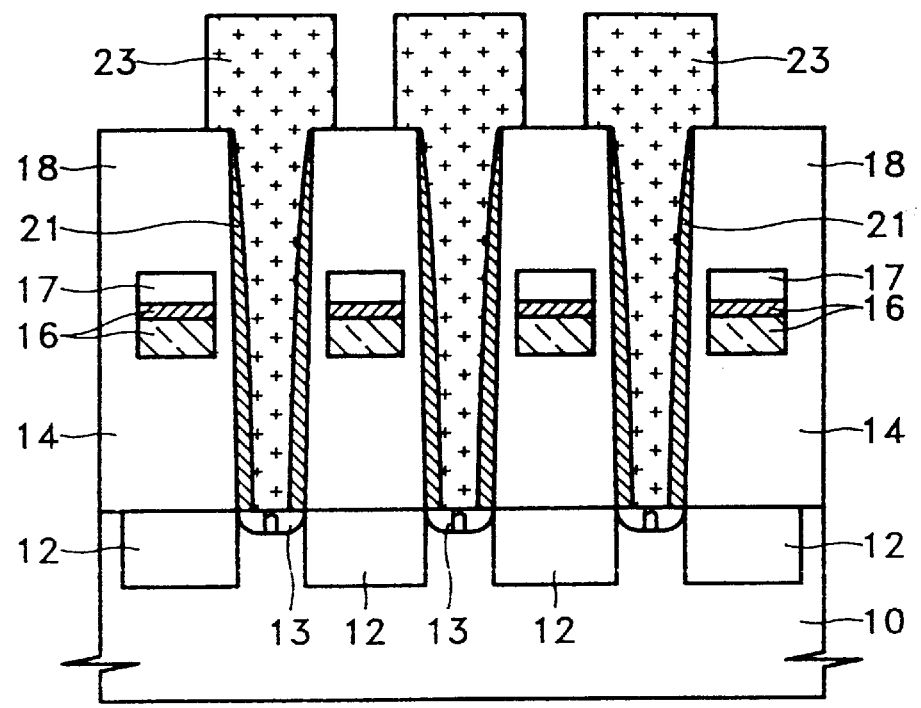
FIGS. 1 and 2 are cross-sectional views of a dynamic random access memory (DRAM) cell according to the prior art.
Figure 2:
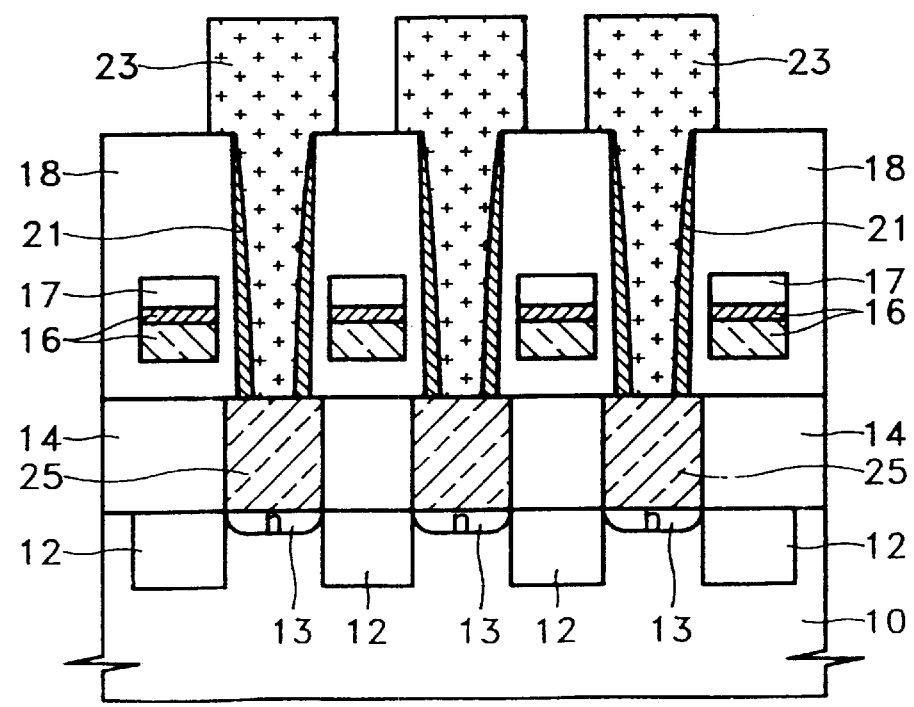

The present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity, and like numbers refer to like elements throughout. Those skilled in the art will understand that the semiconductor regions, e.g., substrate and source/drain regions, described herein may be formed from materials having different conductivity types. As those skilled in the art will understand, the present invention encompasses devices with regions having the conductivity described herein with respect to the illustrated embodiments, as well as complementary devices.

FIG. 3 is a plan view of a DRAM cell in a substrate 100, the cell including a channel electrode plug 130, a channel line 150, a gate line 70 and an active region 50, according to first and second embodiments according to the present invention. FIGS. 4G and 5 are section views taken along lines A–A' and B–B' shown in FIG. 3, respectively. Referring to FIGS. 3, 4G and 5, in a DRAM cell according to the present invention, a semiconductor substrate 100 of first conductivity type has active regions 50 and field regions 105 defined thereon. A DRAM cell includes a pair of spaced apart source/drain region 118,119 of second conductivity type formed in the substrate 100, and a gate line 70 formed on a gate line insulation layer 110 on the substrate 100 between the spaced apart source/drain regions 118,119. Top and sidewall portions of the gate line 70 are covered by a gate line cap 72, including a gate line capping layer 117 and gate line sidewall spacers 120, thus forming a capped gate line 75.

The DRAM cell also includes a dielectric region 80 on the substrate, covering the capped gate line 75. As illustrated, the dielectric region includes a first dielectric layer 125 on the substrate 100, a second dielectric layer 135 on the first dielectric layer 125, and a third dielectric layer 136 on the second dielectric layer 135. A self-aligned storage electrode plug 140 is formed extending from the surface of the third dielectric layer 136 though the third, second and first dielectric layers 136,135,125 and along a first sidewall portion of the gate line cap 72 to contact a first source/drain region 118.

A channel electrode 157 includes a channel electrode plug 130 formed on the first dielectric layer 125, extending through the first dielectric layer 125 and along a sidewall portion of the gate line cap 72 to contact a second source/drain region 119. A channel line 150 is formed on a channel line insulation layer 145 on the third dielectric layer 136, and has a channel line extension 150a extending through the channel line insulation layer 145 and the second dielectric layer 135 to contact the channel electrode plug 130. A channel line cap 156 covers top and sidewall portions of the channel line 150, the cap 156 including a channel line capping layer 152 and channel line sidewall spacers 154 adjacent sidewall portions of the channel line 150 and the channel line capping layer 152, and overlying portions of the channel line insulation layer 145. In a second embodiment according to the present invention, illustrated in FIG. 6, the channel line sidewall spacers 254 extend adjacent to the channel line insulation region 245, which may provide reduced probability of etching through the channel line insulation layer 245 as the cell is fabricated.

Figure 7:
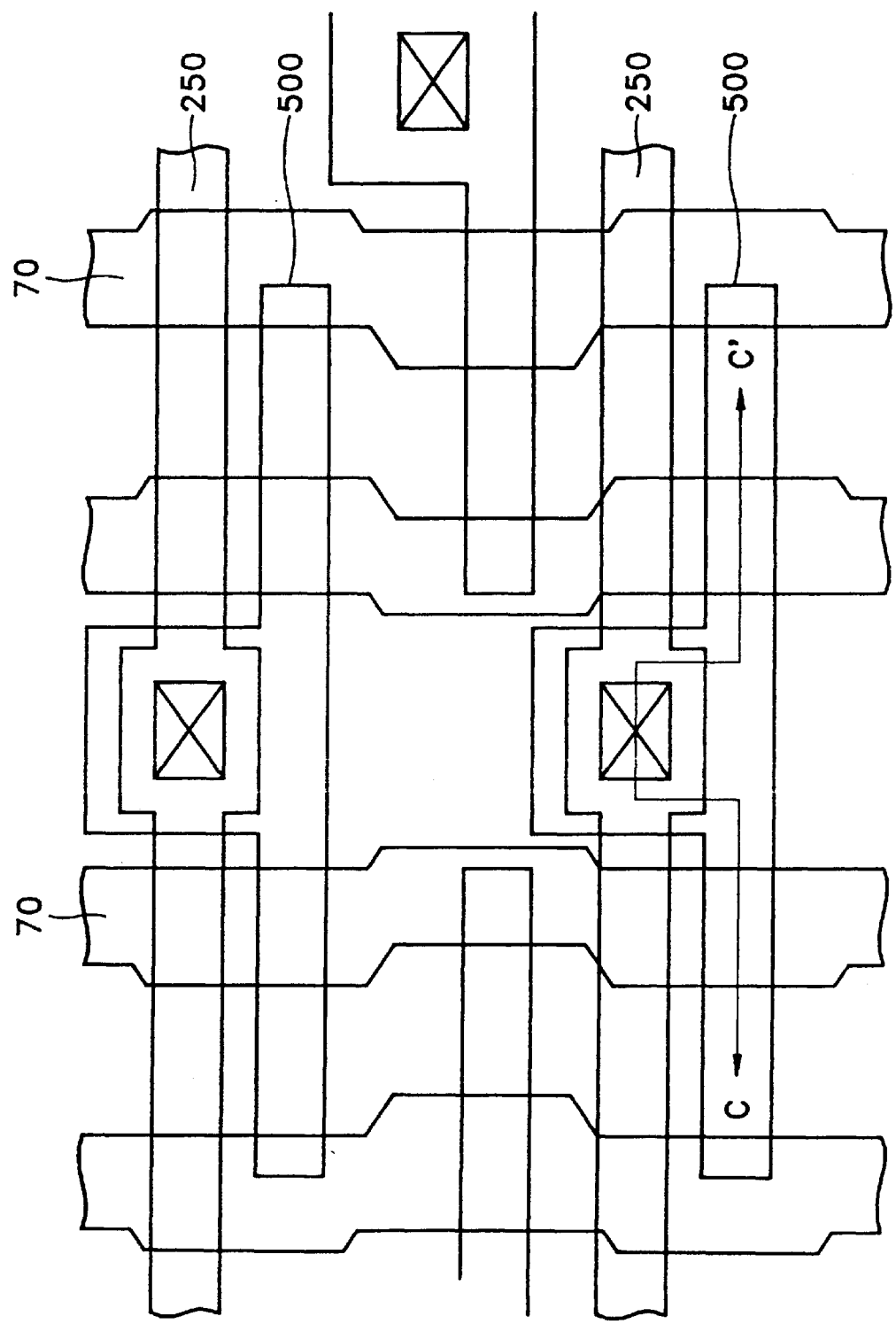
FIG. 7 is a plan view illustrating a third embodiment of a DRAM cell according to the present invention.
Figure 8:
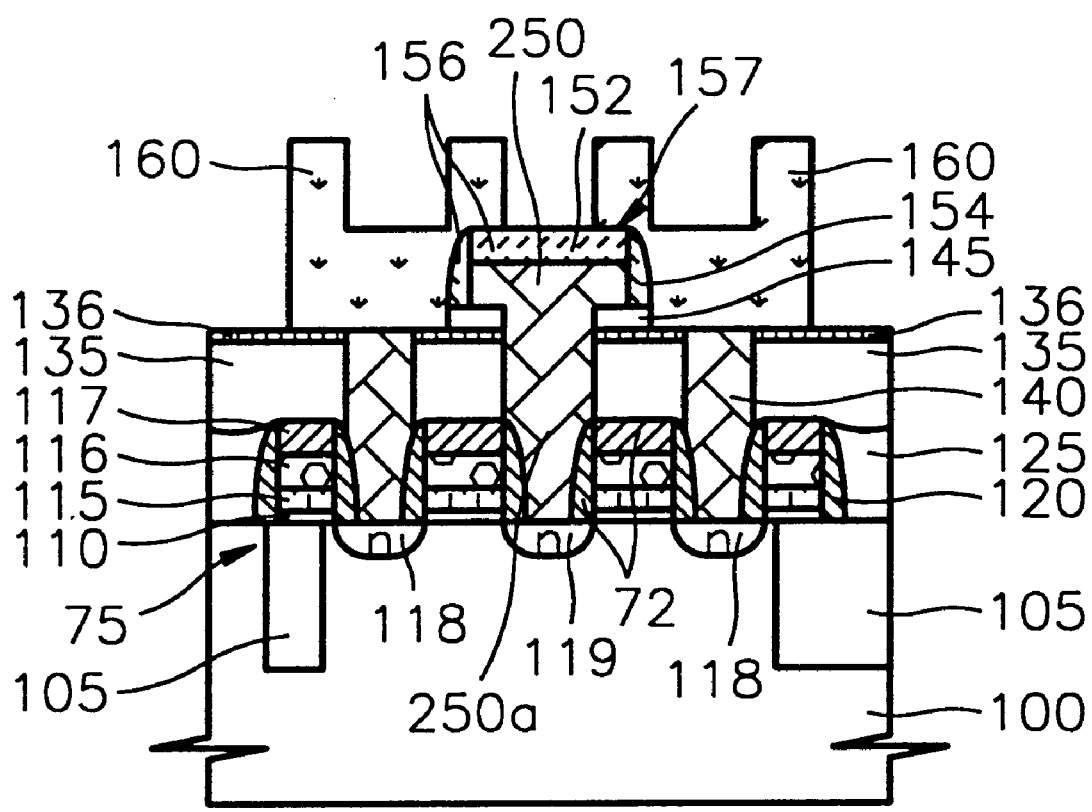
FIG. 8 is a cross-sectional view of a third embodiment of a DRAM cell according to the present invention.

In a third embodiment according to the present invention, illustrated in FIGS. 7 and 8, the self-aligned channel electrode 157 includes a channel line 250 on a channel line insulation layer 145 having a channel line extension 250a extending through the channel line insulation layer 145 and the third, second and first dielectric layers 136,135,125 and along a sidewall portion of the gate line cap 72 to contact the second source/drain region 119. As illustrated in FIG. 7, this continuous structure may be provided by forming the active region 500 and the channel line 250 such that the channel line 250 overlaps the second source/drain region 119 of the active region 500, for example, by using "T" or "Z" shaped patterns for the channel line 250 and/or the active region 500.

Figure 4A:
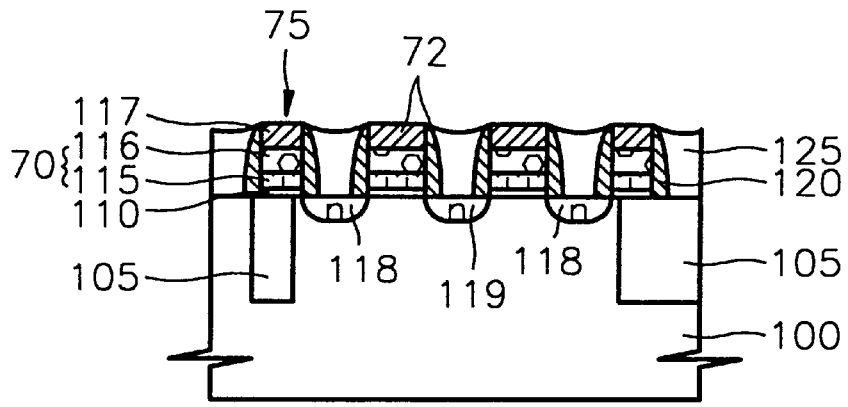
FIGS. 4A–4F are cross-sectional views of intermediate fabrication products illustrating operations for forming a DRAM cell according to the present invention.
Figure 4B:
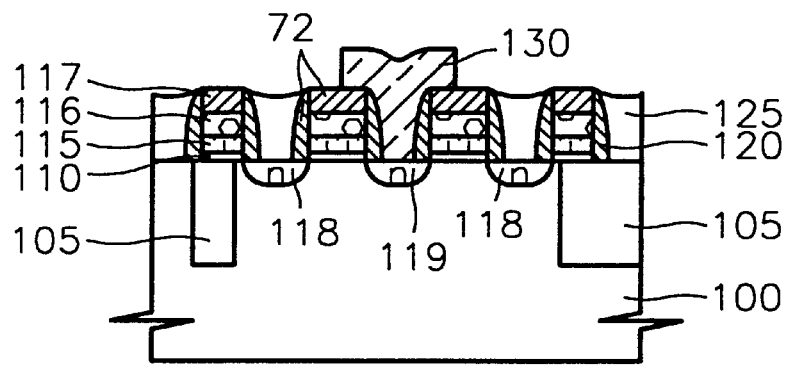
Figure 4C:
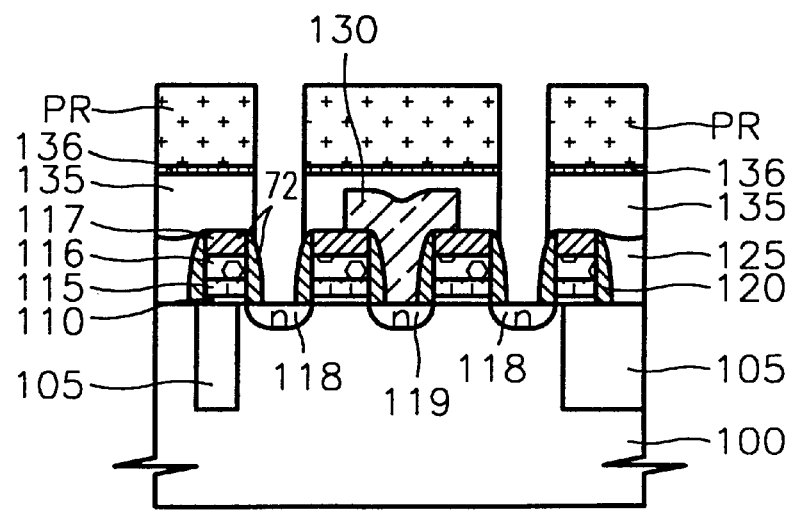
Figure 4D:
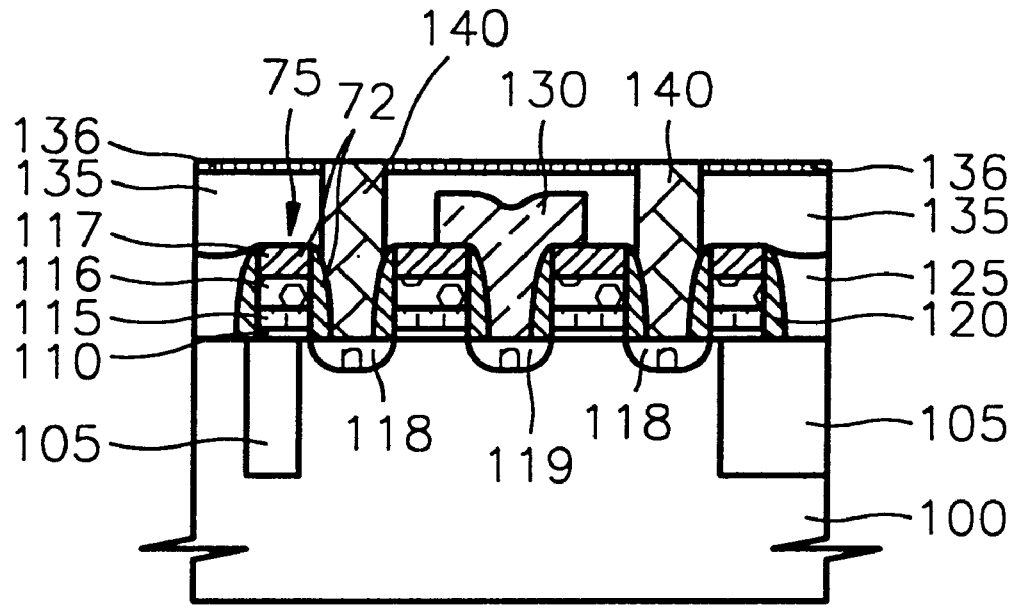
Figure 4E:
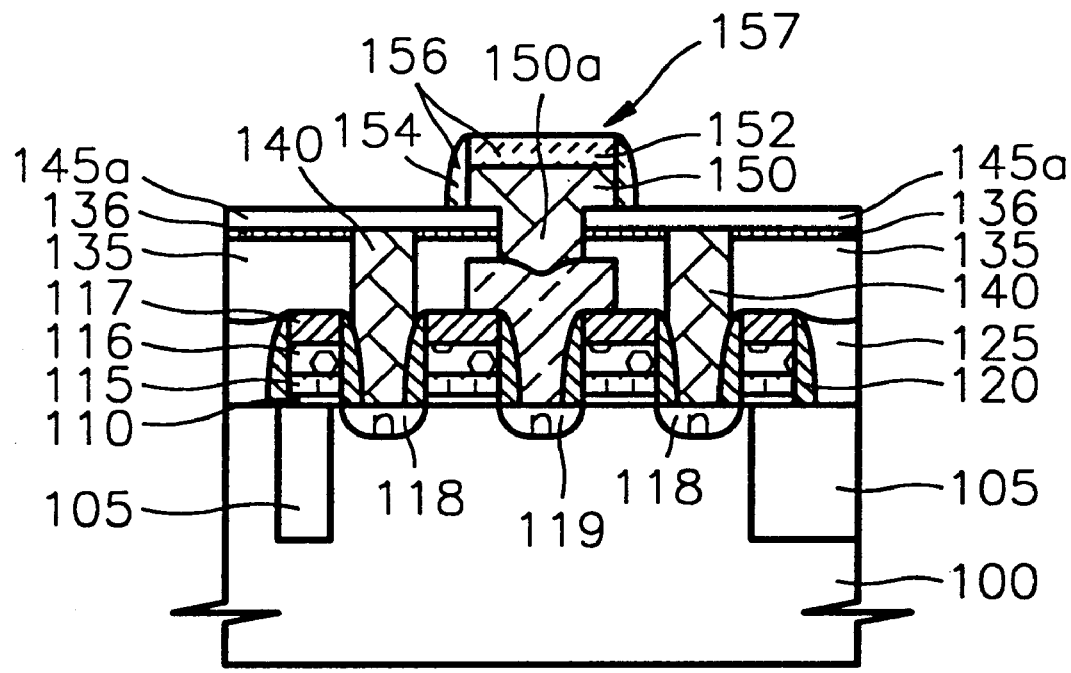
Figure 4F:
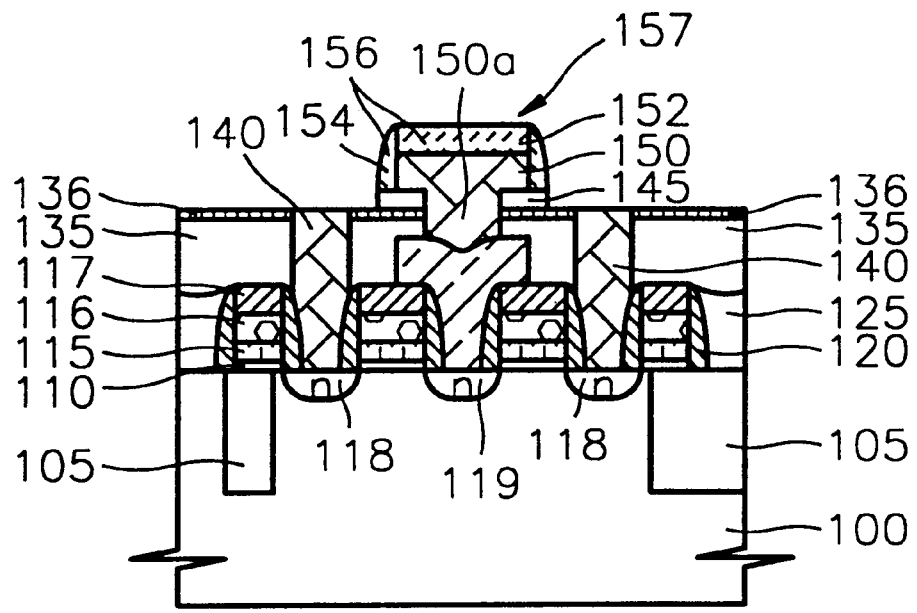
Figure 4G:
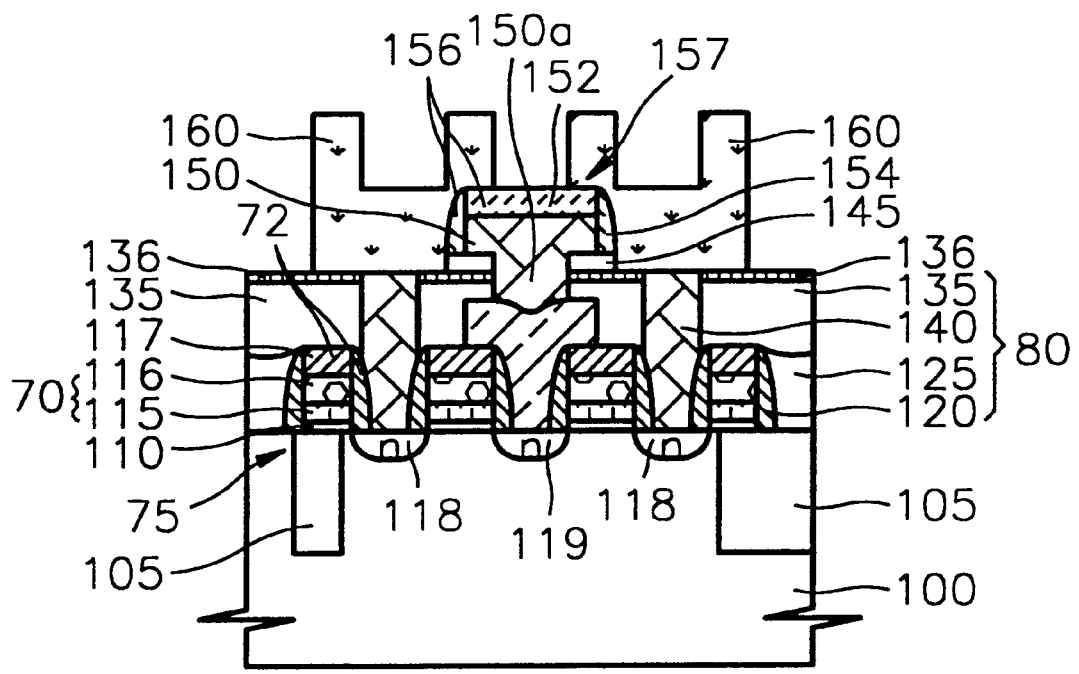
FIGS. 4G and 5 are cross-sectional views of a first embodiment of a DRAM cell according to the present invention.
Figure 5:
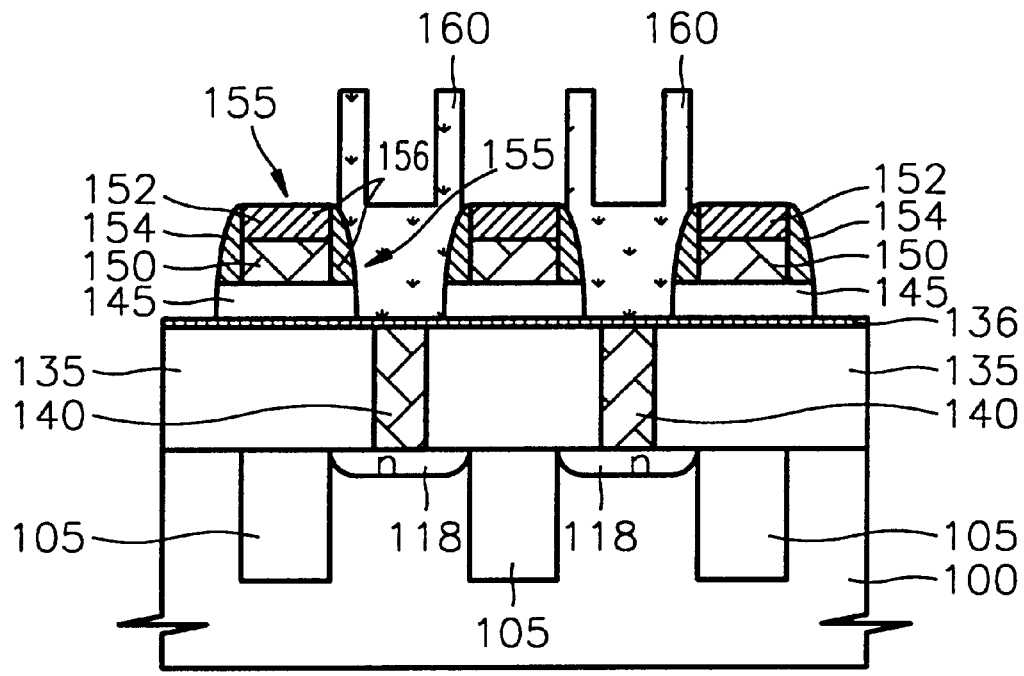

FIGS. 4A through 4G are cross-sectional views which illustrate methods for fabricating a DRAM transistor cell according to a first aspect of the present invention. FIG. 4A illustrates steps for forming a capped gate line 75 and a first dielectric layer 125. Field regions 105 are formed on in a substrate 100, for example, by shallow trench isolation (STI), so that an active region 50 is formed in the substrate 100. Then, a first insulation layer is then formed the substrate 100, a first conductive layer is formed on the first insulation layer, a second conductive layer is formed on the first conductive layer, and a second insulation layer formed on the second conductive layer. The second insulation layer, the second conductive layer, the first conductive layer and the first insulation layer are then patterned to formed a gate line insulation layer 110 on the substrate 100, a first gate line region 115 on the gate line insulation layer 110, a second gate line region 116 on the first gate line region 115, and a gate line capping layer 117 on the second gate line region 116. The gate line 70 thereby formed preferably has a polycide structure, with the first gate line region 115 including doped polysilicon, and the second gate line region 116 including metal silicide. The gate line capping layer 117 preferably includes silicon oxide or silicon nitride.

Spaced apart source/drain regions 118,119 are formed on opposite sides of the gate line 70. Preferably, the source/drain regions 118,119 are formed by implanting ions of second conductivity type into the substrate 100 using the structure including the gate line capping layer 117, the gate line 70, and the gate line insulation layer 110 as a mask.

To form gate line sidewall spacers 120, a third insulation layer is formed, preferably silicon nitride having thickness of approximately 500 Å. Gate line sidewall spacers 120 may then be formed by anisotropically etching the third insulation layer. To form the first dielectric layer 125, a first dielectric layer is formed, preferably of borophosphosilicate glass (BPSG) having an excellent fluidity or $O_3$-TEOS, with thickness sufficient to cover the gate line capping layer 117. The first dielectric layer 125 may then be planarized, for example, using a reflow process or an etch-back process combined with a reflow process.

FIG. 4B illustrates steps for forming a channel electrode plug 130. Portions of the first dielectric layer 125 overlying a source/drain region 119 are removed to expose a sidewall portion of the gate line cap 72 and the source/drain region 119. A conductive layer, preferably doped polysilicon, is then formed on the first dielectric layer 125, extending through the first dielectric layer 125 and along the exposed sidewall portion of the gate line cap 72 to contact the exposed source/drain region 119. The conductive layer is then patterned to form the channel electrode plug 130.

FIGS. 4C–4D illustrate steps for forming a second dielectric layer 135, a third dielectric layer 136, and a storage electrode plug 140. A second dielectric layer 135, preferably $O_3$-TEOS, is formed on the first dielectric layer 125 and the channel electrode plug 130, and planarized, preferably by etching back or by chemical mechanical polishing (CMP). A third dielectric layer 136, preferably silicon nitride, is then formed on the second dielectric layer 135. Portions of the third dielectric layer 136, the second dielectric layer 135 and the first dielectric layer 125 overlying a source/drain region 118 are then removed, preferably by dry-etching using a predetermined mask PR, to expose a sidewall portion of the gate line cap 72 and the source/drain region 118.

To form the storage electrode plug 140, a conductive layer is formed on the third dielectric layer 136, extending along a sidewall portion of the gate line cap 72 to contact the exposed source/drain region 118. The conductive layer preferably includes a single layer of tungsten having an excellent conductivity or accumulated layers of tungsten and tungsten/tungsten nitride (Ti/TiN) barrier metal. The conductive layer is then planarized to remove portions of the conductive layer overlying the third dielectric layer 136. Planarization may be performed by a CMP process using the third dielectric layer 136 as a polish stopper such that the conductive layer overlying the third dielectric layer 136 is completely removed, leaving the storage electrode plug 140. Alternatively, an etching-back process may be employed wherein the third dielectric region 135 is used as an etching stopper.

FIGS. 4E–4F illustrate further steps for forming a channel electrode 157. A first insulation layer 145a is formed on the third dielectric layer 136, preferably by chemical vapor deposition (CVD) of silicon oxide at a lower temperature of approximately 300° to approximately 400° C. in order to minimize oxidation of the storage electrode plug 140. Preferably, the first insulation layer 145a has a thickness of approximately 500 Å to approximately 1000 Å. Next, portions of the first insulation layer, the third dielectric layer 136 and the second dielectric layer 135 above the channel electrode plug 130 are removed to expose the channel electrode plug 130.

A conductive layer, preferably of tungsten having an excellent conductivity or metal silicide and including a barrier metal layer of Ti/TiN, is then formed on the first insulation layer 145a, contacting the exposed channel electrode plug 130, and a second insulation layer formed on the conductive layer. The second insulation layer and the conductive layer are then patterned to form a channel line 150 and a channel line capping layer 152. The channel line 150 has a channel line extension 150a extending through the channel line insulation layer 145a, and the second and third dielectric layers 136,135 to contact the channel electrode plug 130. A third insulation layer is then formed covering sidewall portions of the channel line capping layer 152 and the channel line 150, preferably to a thickness of approximately 1000 Å to approximately 3000 Å, and the third insulation layer anisotropically etched to leave channel line sidewall spacers 154 adjacent the channel line capping layer 152 and the channel line 150, overlying the first insulation layer 145a. As illustrated in FIG. 4F, portions of the third dielectric layer 136 and the storage electrode contact plug 140 may then be exposed by etching, using the channel line cap 156 as a mask.

Figure 6:
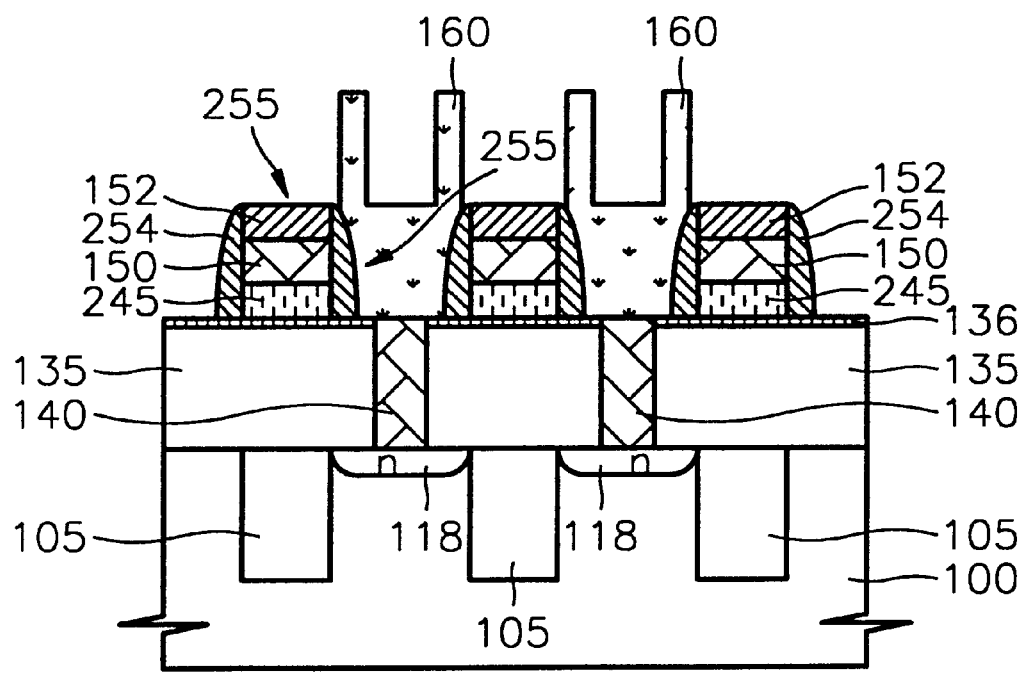
FIG. 6 is a cross-sectional view of a second embodiment of a DRAM cell according to the present invention.

FIG. 6 is a cross-sectional view of a second embodiment of a DRAM cell according to the present invention produced according to second method aspect wherein the channel line cap structure is modified. In forming the channel line 150, the second insulation layer, the conductive layer and the first insulation layer 145a are patterned to form a channel line insulation layer 245, a channel line 150 on the channel line insulation layer 245, and a channel line capping layer 152 on the channel line 150. A third insulation layer is then formed covering sidewall portions of the channel line capping layer 152 and the channel line 150, preferably to a thickness of approximately 1000 Å to approximately 3000 Å, and the third insulation layer anisotropically etched to leave channel line sidewall spacers 254 adjacent the channel line capping layer 152 and the channel line 150, and which extend adjacent to the channel line insulation layer 245. As with the previously described embodiment, portions of the third dielectric layer 136 and the storage electrode contact plug 140 may then be exposed by etching, using the channel line cap 256 as a mask. Those skilled in the art will appreciate that forming the channel line sidewall spacers 254 in this manner may prevent etching-through of the channel line insulation layer 245 and thus prevent shorting when a storage electrode 160 is subsequently formed.

FIG. 4G illustrates forming a storage electrode 160 contacting the exposed storage electrode plug 140. Subsequent steps for forming a DRAM cell, including formation of a dielectric film and plate electrode, and interconnection of the resulting DRAM cell are not illustrate but are well-known to those skilled in the art.

In a third method aspect according to the present invention, the number of processes used to fabricate of a DRAM transistor cell may be reduced by forming the channel line 250 such that a separately-formed channel electrode plug is unnecessary. In particular, as illustrated in FIG. 7, the channel line 250 may be formed such that it overlies a source/drain region 119 of the active region 500. Referring to FIG. 7, in order to secure an adequate photo-lithographic margin, the channel line 250 may be patterned in the form of a "IT", so that it overlaps the source/drain region 119 in the active region 500. Those skilled in the art will understand that other arrangements may be used with the present invention to provide the desired alignment of the channel line 250 and the source/drain region 119. For example, a "Z"-shaped pattern may be employed for the channel line 250 and/or the active region 500.

As illustrated in FIG. 8, to form a channel line 250, a first insulation layer is formed on the third dielectric layer 136. Portions of the first insulation layer and the first, second and third dielectric layers 125,135,136 overlying the second source/drain region 119 and adjacent a sidewall portion of the gate line cap 72 are then removed to expose the second source/drain region 119. A conductive layer is then formed on the insulation layer extending along the exposed sidewall portion of the gate line cap 72 and contacting the exposed portions of the second source/drain region 119. A second insulation layer, preferably silicon nitride, is then formed on the conductive layer, and the second insulation layer, the conductive layer and the first insulation layer patterned to form a channel line 252 on a channel line insulation layer 145, a channel line extension 250a extending from the channel line to contact the second source/drain region 119, and a channel line cap 156 including a channel line capping layer 152 and channel line sidewall spacers 154 on sidewall portions of the channel line 252.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A dynamic random access memory (DRAM) cell, comprising:

a capped gate line on a substrate, said capped gate line including a gate line insulation layer on said substrate, a gate line on said gate line insulation layer and a gate line cap covering top and sidewall portions of said gate line;

spaced apart source/drain regions in the substrate, on opposite sides of said gate line;

a dielectric region on said substrate, covering said capped gate line;

a storage electrode plug extending through said dielectric region and along a first sidewall portion of said gate line cap to contact a first of said source/drain regions; and a channel electrode plug extending through said dielectric region and along a second sidewall portion of said gate line cap to contact a second of said source/drain regions, wherein said dielectric region comprises:

a first dielectric layer covering said capped gate line;
a second dielectric layer on said first dielectric layer; and
a third dielectric layer on said second dielectric layer, said third dielectric layer having a surface;
wherein said storage electrode plug extends from said surface of said third dielectric layer through said second and first dielectric layers to contact said first source/drain region; and
wherein said channel electrode plug extends from within said second dielectric layer through said first dielectric layer to contact said second source/drain region.

2. A DRAM cell according to claim 1 wherein said gate line cap comprises:
a gate line capping layer on a top portion of said gate line; and
gate line sidewall spacers covering sidewall portions of said gate line and said gate line capping layer.

3. A dynamic random access memory (DRAM) cell, comprising:
a capped gate line on a substrate, said capped gate line including a gate line insulation layer on said substrate, a gate line on said gate line insulation layer and a gate line cap covering top and sidewall portions of said gate line;
spaced apart source/drain regions in the substrate, on opposite sides of said gate line;
a dielectric region on said substrate, covering said capped gate line;
a storage electrode plug extending through said dielectric region and along a first sidewall portion of said gate line cap to contact a first of said source/drain regions;
a channel line insulation layer on said dielectric region;
a channel line on said channel line insulation layer, said channel line having a channel line extension extending through said channel line insulation layer into said dielectric region;
a channel line cap covering top and sidewall portions of said channel line;
a channel electrode plug extending from said channel line extension through said dielectric region and along said second sidewall portion of said gate line cap to contact a second of said source/drain regions; and
a storage electrode on said dielectric region and said storage electrode plug, extending along a sidewall portion of said channel line cap;
wherein said dielectric region comprises:
a first dielectric layer covering said capped gate line;
a second dielectric layer on said first dielectric layer; and
a third dielectric layer on said second dielectric layer;
wherein said channel line insulation layer comprises a channel line insulation layer on said third dielectric layer;
wherein said channel electrode plug comprises a channel electrode plug on said first dielectric layer, extending through said first dielectric layer and along said second sidewall portion of said gate line cap to contact said second source/drain region;
wherein said channel line comprises a channel line on said channel line insulation layer, said channel line having a channel line extension extending through said channel line insulation layer, said third dielectric layer and said second dielectric layer to contact said channel electrode plug; and wherein said channel line cap comprises:
a channel line capping layer on a top portion of said channel line; and
channel line sidewall spacers covering sidewall portions of said channel line and said channel line capping layer.

4. A DRAM cell according to claim 3 wherein said channel line sidewall spacers cover sidewall portions of said channel line, said channel line capping layer and said channel line insulation layer.

5. A dynamic random access memory (DRAM) cell, comprising:
a capped gate line on a substrate, said capped gate line including a gate line insulation layer on said substrate, a gate line on said gate line insulation layer and a gate line cap covering top and sidewall portions of said gate line;
spaced apart source/drain regions in the substrate, on opposite sides of said gate line;
a dielectric region on said substrate, covering said capped gate line;
a storage electrode plug extending through said dielectric region and along a first sidewall portion of said gate line cap to contact a first of said source/drain regions;
a channel line insulation layer on said dielectric region;
a channel line on said channel line insulation layer, overlying said second source/drain region, said channel line having a channel line extension extending through said channel line insulation layer and said dielectric region and along said second sidewall portion of said gate line cap to contact a second of said source/drain regions;
a channel line cap covering top and sidewall portions of said channel line; and
a storage electrode on said dielectric region and said storage electrode plug, extending along a sidewall portion of said channel line cap;
wherein said dielectric region comprises:
a first dielectric layer covering said capped gate line;
a second dielectric layer on said first dielectric layer; and
a third dielectric layer on said second dielectric layer;
wherein said channel line insulation layer comprises a channel line insulation layer on said third dielectric layer;
wherein said channel line comprises a channel line on said channel line insulation layer, said channel line having a channel line extension extending through said channel line insulation layer, said third dielectric layer, said second dielectric layer and said first dielectric layer and along said second sidewall portion of said gate line cap to contact said second source/drain region; and
wherein said channel line cap comprises:
a channel line capping layer on a top portion of said channel line; and
channel line sidewall spacers covering sidewall portions of said channel line and said channel line capping layer.

6. A DRAM cell according to claim 5 wherein said channel line sidewall spacers cover sidewall portions of said channel line, said channel line capping layer and said channel line insulation layer.

* * * * *